(12) United States Patent
Waller et al.

(10) Patent No.: US 12,277,985 B2
(45) Date of Patent: Apr. 15, 2025

(54) TECHNOLOGIES FOR REPAIR OF MEMORY WITH ACCESS LINES

(71) Applicant: Intel Corporation, Santa Clara, CA (US)

(72) Inventors: William K. Waller, Boise, ID (US); Dhruval J. Patel, Folsom, CA (US); Xiannan Di, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 747 days.

(21) Appl. No.: 17/390,425

(22) Filed: Jul. 30, 2021

(65) Prior Publication Data

US 2023/0033277 A1 Feb. 2, 2023

(51) Int. Cl.
*G11C 29/00* (2006.01)
*G11C 29/14* (2006.01)
(Continued)

(52) U.S. Cl.
CPC .......... *G11C 29/4401* (2013.01); *G11C 29/14* (2013.01); *G11C 29/18* (2013.01); *G11C 29/785* (2013.01); *G11C 2029/1202* (2013.01)

(58) Field of Classification Search
CPC ............ G11C 7/1006; G11C 11/40618; G11C 11/4076; G11C 11/4087; G11C 29/36; G11C 29/38; G11C 2029/2602; G11C 2029/3602; G11C 29/006; G11C 29/56; G11C 29/42; G11C 16/26; G11C 29/82; G11C 11/2255; G11C 11/2273; G11C 16/08; G11C 29/52; G11C 5/025; G11C 2029/4402; G11C 29/4401; G11C 11/221; G11C 11/2253; G11C 11/2257; G11C 11/2259; G11C 11/2293; G11C 11/2295; G11C 11/2297; G11C 11/4096; G11C 16/0466; G11C 16/10; G11C 16/14; G11C 16/24; G11C 16/32; G11C 2029/0411; G11C 29/028; G11C 29/76; G11C 7/1045; G11C 7/1048; G11C 7/1069; G11C 8/12; G11C 8/14; G11C 11/5642; G11C 16/0483; G11C 16/06; G11C 16/22; G11C 16/3418; G11C 16/349; G11C 2029/1202; G11C 2211/5634; G11C 29/14; G11C 29/18; G11C 29/785; G11C 7/10

See application file for complete search history.

(56) References Cited

U.S. PATENT DOCUMENTS 10,311,921 B1 * 6/2019 Parkinson .......... G11C 13/0004
2013/0117602 A1 5/2013 Kim et al.
(Continued)

*Primary Examiner* — Thong Q Le
(74) *Attorney, Agent, or Firm* — Alliance IP, LLC

(57) ABSTRACT

Techniques for repair of a memory die are disclosed. In the illustrative embodiment, a faulty wordline (or bitline) can be remapped to a redundant wordline on the same layer by entering the address of the faulty wordline in a repair table for the layer. If there are more faulty wordlines on a layer than redundant wordlines available on the layer, the faulty wordlines can be remapped to redundant wordlines on a different layer, and the address of the faulty wordline can be placed in a repair table for the different layer. When a memory operation is received, the wordline address for the memory operation is checked against the repair tables to check if it remapped.

20 Claims, 8 Drawing Sheets

(51) Int. Cl.
*G11C 29/18* (2006.01)
*G11C 29/44* (2006.01)
*G11C 29/12* (2006.01)

(56) References Cited

U.S. PATENT DOCUMENTS

2020/0411132 A1 12/2020 Hulton et al.
2021/0043685 A1 2/2021 Redaelli et al.

* cited by examiner

| 514 | WORDLINE LAYER 0 REPAIR TABLE |
|---|---|
| 602 | 0x787D |
|  | 0x50F3 |
|  | 0x0C38 |
|  | 0x1A92 |
|  | 0x39D4 |
|  | 0x1FD0 |
|  | 0x60D3 |
|  | 0x5BE3 |
|  | 0x5A48 |
|  | 0x6069 |
|  | 0x7CDF |
|  | 0x4091 |
|  | 0x2DB9 |
|  | 0x3C82 |
|  | 0x27F0 |
|  | 0x7180 |

FIG. 6

| 516 | WORDLINE LAYER 1 REPAIR TABLE |
|---|---|
| 702 | 0xB6F6 |
|  | 0xCA36 |
|  | 0x9BA6 |
|  | 0xC085 |
|  | 0xA3C3 |
|  | 0xD8DD |
|  | 0x8299 |
|  | 0x9E23 |
|  | 0xA349 |
|  | 0xF3FC |
|  | 0xEF83 |
|  | 0x8FC5 |
| 704 | 0x7180 |
| 706 | 0x1A06 |

FIG. 7

TECHNOLOGIES FOR REPAIR OF MEMORY WITH ACCESS LINES

BACKGROUND

In some memory types, such as phase-change-based memory, a memory die includes an array of wordlines and an array of bitlines, with a memory cell at each crossing of a wordline and bitline. The memory die may have several layers of wordlines and bitlines arranged vertically.

A memory die may have a small number of wordlines or bitlines that are faulty, such as by being shorted, open, or connected to a faulty memory cell. In some cases, memory accesses to a faulty wordline (or bitline) can be moved to a redundant section of memory on the same layer. The wordlines (or bitlines) that are faulty can be stored in a table. Whenever a memory operation includes a memory address corresponding to a wordline (or bitline) stored in the table, the redundant wordline (or bitline) is activated instead of the wordline corresponding to the memory address.

Because errors in wordlines (or bitlines) tend to group together and because storing a large number of addresses in the table can use significant resources, wordlines (or bitlines) may be remapped to redundant wordlines (or bitlines) in a group of four. In particular, when a faulty wordline (or bitline) is identifier, an adjacent wordline (or bitline) on the same layer, a wordline (or bitline) on an adjacent layer, and an adjacent wordline (or bitline) to the wordline (or bitline) on an adjacent layer are all replaced, allowing four wordlines (or bitlines) to be replaced with one entry in the table.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

FIG. 6 illustrates one embodiment of a wordline repair table.

FIG. 7 illustrates one embodiment of a wordline repair table.

DETAILED DESCRIPTION OF THE DRAWINGS

Figure 1:
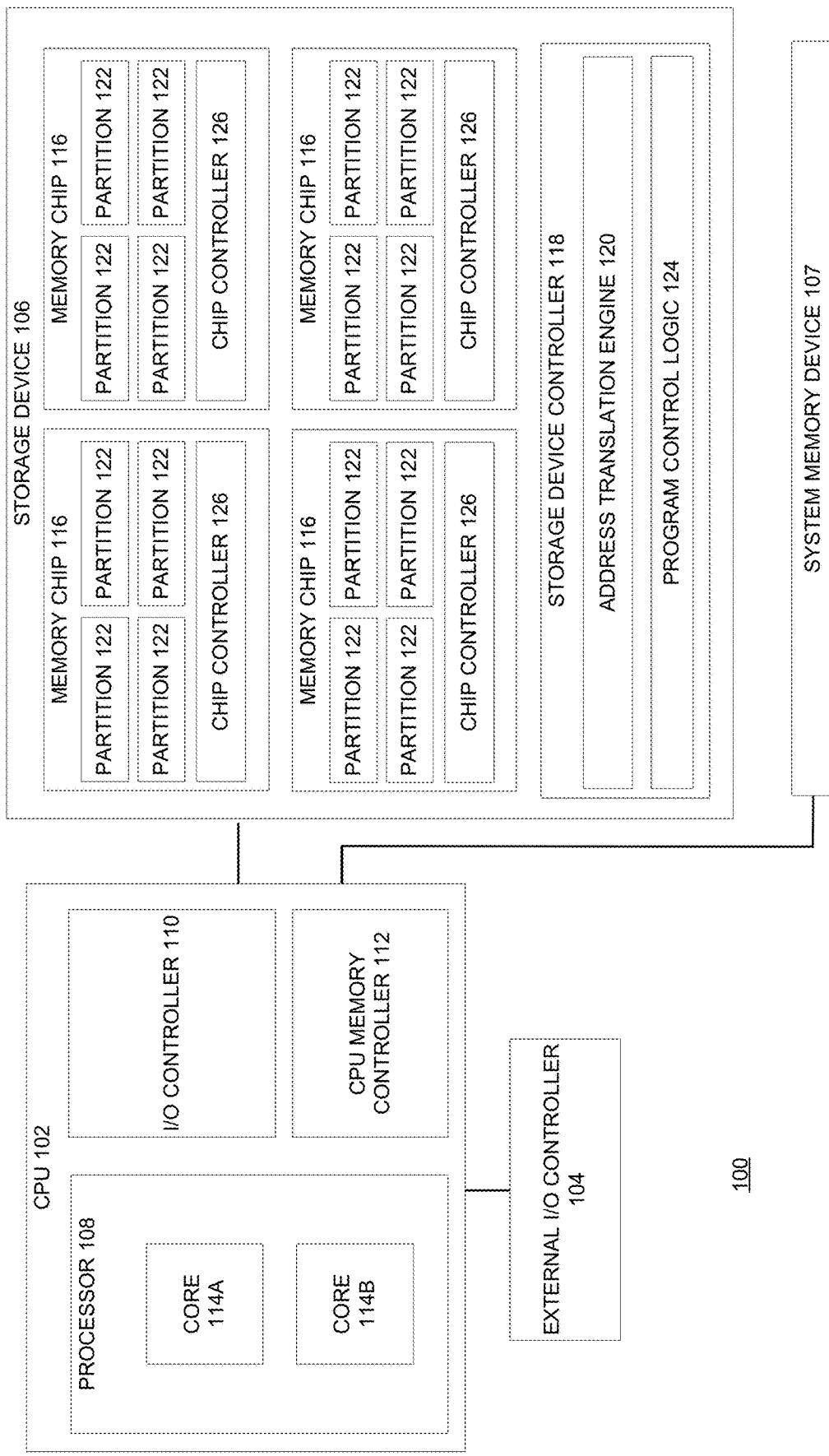
FIG. 1 illustrates components of a computer system in accordance with certain embodiments.

In the illustrative embodiment, as described in more detail below, a memory die (such as memory die 500 in FIG. 5) has access line repair tables 510, such as a layer 0 wordline repair table 514 and a layer 1 wordline repair table 516. At manufacturing time, each wordline is checked for a fault. If a fault is found, then the wordline is entered in the corresponding access line repair table 510, remapping the faulty wordline to a redundant wordline in the same wordline layer. If the access line repair table 510 for the layer that the wordline is on is full, then the wordline can be entered in an access line repair table 510 of a different layer, remapping the faulty wordline to a redundant wordline on a different layer. Each bitline can be checked and repaired in a similar manner.

In use, as described in more detail below, when a memory operation is received, the access line repair table 510 corresponding to the wordline layer of the wordline address of the memory operation is checked. If a match is found, then the memory operation is remapped to the address in the table. If a match is not found and the table is not full, then the wordline is not faulty. If a match is not found and the table is full, then the wordline was potentially remapped to a different layer, and the access line repair table 510 for another layer is checked as well. If a match is not found in the table 510 for the other layer, then the wordline is not faulty. If a match is found in the table 510 for the other layer, then the wordline is remapped to the other layer. The bitline can be checked and remapped in parallel in a similar manner.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid. In other embodiments, the memory partition 122 may include an array of another type of memory, such as 3D NAND.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a magnetic storage disk or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http:// www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data.

The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
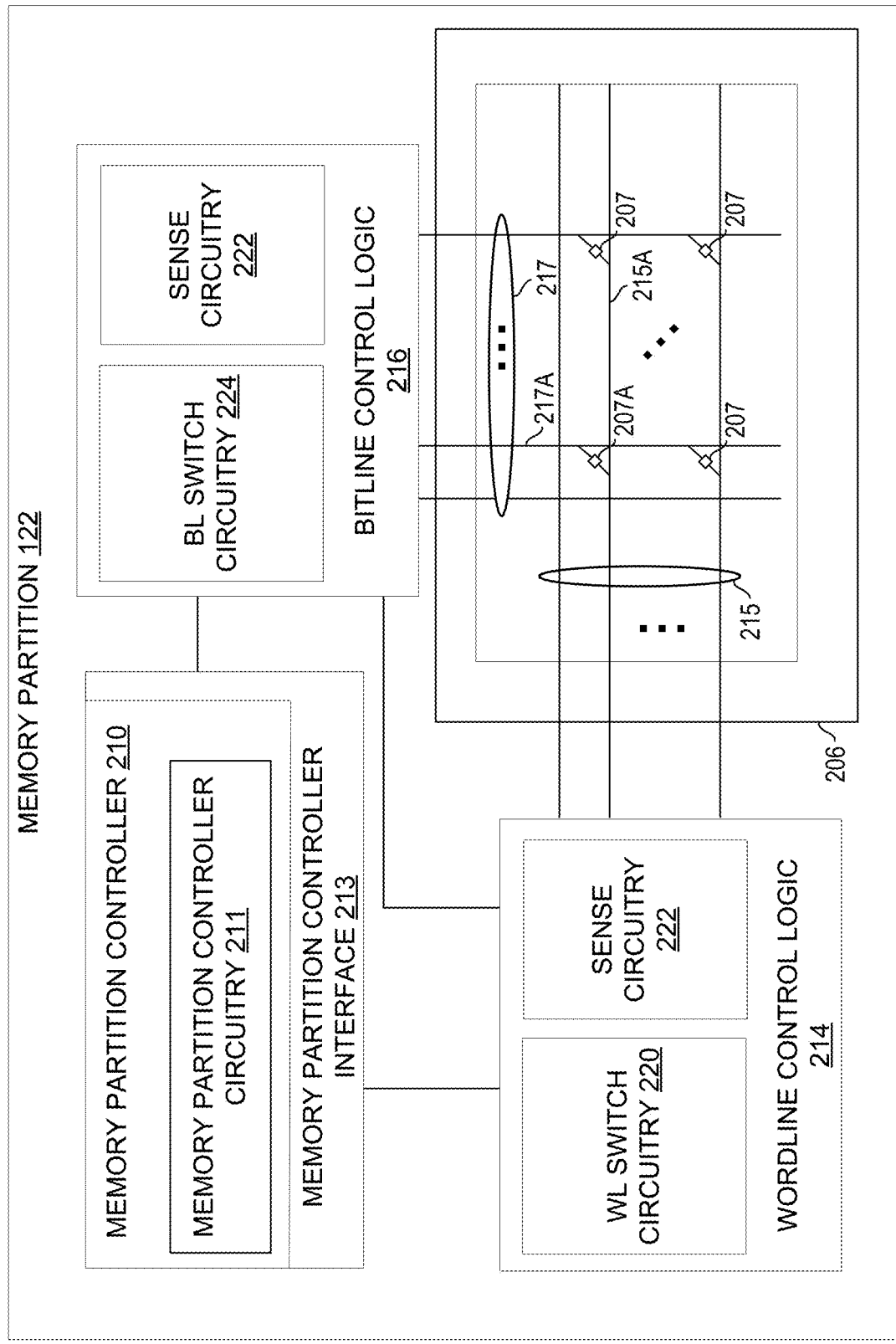
FIG. 2 illustrates a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222.

WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current ($i_{cell}$) in the memory cell 207A dependent on a program state of the memory cell. A comparator such as a sense amplifier may compare $i_{cell}$ with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
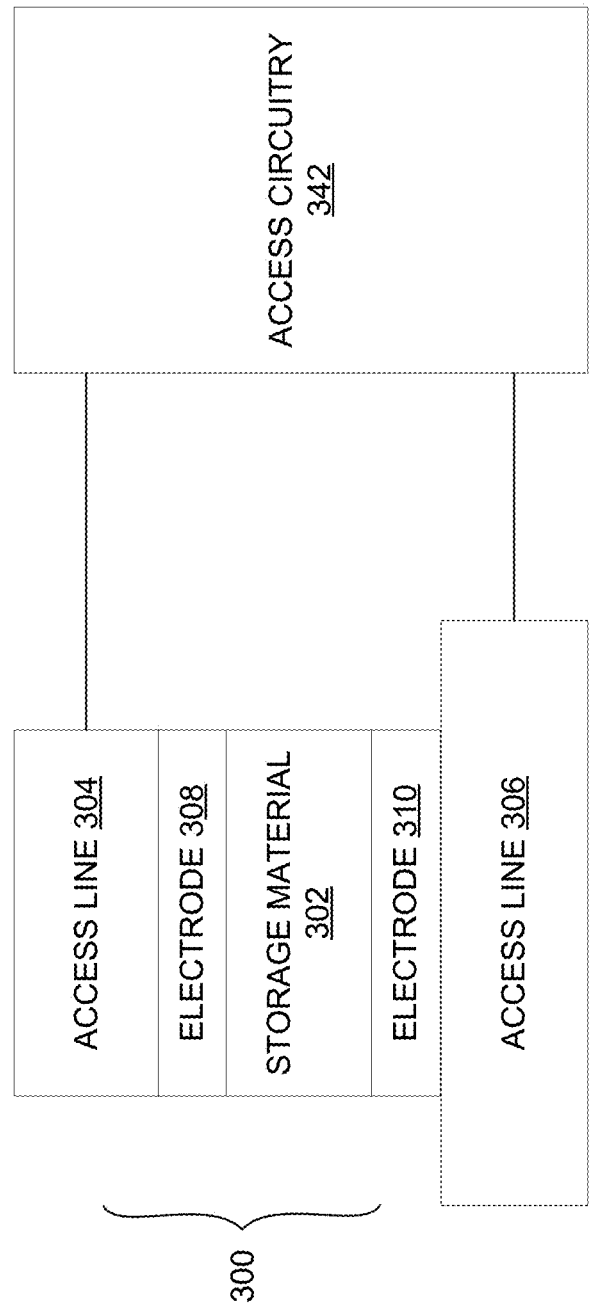
FIG. 3 illustrates a memory cell coupled to access circuitry in accordance with certain embodiments.

FIG. 3 illustrates a memory cell 300 coupled to access circuitry 342 in accordance with certain embodiments. The memory cell 300 includes a storage material 302 between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry.

In one embodiment, storage material 302 includes a self-selecting material that exhibits memory effects. A self-selecting material is a material that enables selection of a memory cell in an array without requiring a separate selector element. Thus, storage material 302 may represent a "selector/storage material." A material exhibits memory effects if circuitry (e.g., 342) for accessing memory cells can cause the material to be in one of multiple states (e.g., via a write operation) and later determine the programmed state (e.g., via a read operation). Access circuitry 342 can store information in the memory cell 300 by causing the storage material 302 to be in a particular state. The storage material 302 can include, for example, a chalcogenide material or other material capable of functioning as both a storage element and a selector, to enable addressing a specific memory cell and determining what the state of the memory cell is. Thus, in one embodiment, the memory cell 300 is a self-selecting memory cell that includes a single layer of material that acts as both a selector element to select the memory cell and a memory element to store a logic state. In the embodiment depicted, each memory cell 300 is a two-terminal device (i.e., the memory cell 300 has two electrodes to receive control signals sufficient to write to and read from the memory cell 300).

In other embodiments, each memory cell (e.g., 300) includes a memory element configured to store information and a separate memory cell select device (e.g., selector) coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device.

The storage material 302 may include any suitable material programmable to a plurality of states. In some embodiments, the storage material 302 may include a chalcogenide material comprising a chemical compound with at least one chalcogen ion, that is, an element from group 16 of the periodic table. For example, the storage material 302 may include one or more of: sulfur (S), selenium (Se), or tellurium (Te). Additionally or alternatively, in various embodiments, storage material 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In various examples, the storage material 302 may include one or more chalcogenide materials such as such as Te—Se, Ge—Te, In—Se, Sb—Te, Ta—Sb—Te, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, or Se—As—Ge—Si—In. In other various examples, storage material 302 may include other materials capable of being programmed to one of multiple states, such as Ge—Sb, Ga—Sb, In—Sb, Sn—Sb—Bi, or In—Sb—Ge. One or more elements in a chalcogenide material (or other material used as storage material 302) may be dopants. For example, the storage material 302 may include dopants such as: aluminum (Al), oxygen (O), nitrogen (N), silicon (Si), carbon (C), boron (B), zirconium (Zr), hafnium (Hf), or a combination thereof. In some embodiments, the chalcogenide material (or other material used as storage material 302) may include additional elements such as hydrogen (H), oxygen (O), nitrogen (N), chlorine (Cl), or fluorine (F), each in atomic or molecular forms. The storage material 302 may include other materials or dopants not explicitly listed. In some examples, the storage material (such as any of the materials described above) is a phase change material. In other examples, the storage material 302 is not a phase change material, e.g., can be in one or multiple stable states (or transition between stable states) without a change in phase.

In some embodiments, a selector element coupled to storage material (e.g., in non-self-selecting memory cells) may also include a chalcogenide material. A selector device having a chalcogenide material can sometimes be referred to as an Ovonic Threshold Switch (OTS). An OTS may include a chalcogenide composition including any one of the chalcogenide alloy systems described above for the storage element and may further include an element that can suppress crystallization, such as arsenic (As), nitrogen (N), or carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

In some embodiments, an element from column III of the periodic table ("Group III element") may be introduced into a chalcogenide material composition to limit the presence of another material (e.g., Ge) in the selector device. For example, a Group III element may replace some or all of the other material (e.g., Ge) in the composition of the selector device. In some embodiments, a Group III element may form a stable, Group III element-centered tetrahedral bond structure with other elements (e.g., Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

In one embodiment, each selector device comprises a chalcogenide material having a composition of Se, As, and at least one of B, Al, Ga, In, and Tl. In some cases, the composition of the chalcogenide material comprises Ge or Si, or both.

In one example, the storage material is capable of switching between two or more stable states without changing phase (in other examples the storage material may switch between two stable states by changing phase). In one such embodiment, the access circuitry 342 programs the memory cell 300 by applying one or more program pulses (e.g., voltage or current pulses) with a particular polarity to cause the storage material 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300. In various embodiments below, programming states are depicted as being associated with a single programming pulse, however, the single programming pulse may also be equivalent to a series of programming pulses that have the effective characteristics of the single programming pulse (e.g., a width of the single programming pulse may be equivalent to the sum of the widths of a series of shorter programming pulses).

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage in response to the application of a subsequent voltage (e.g., through application of a read pulse with a particular voltage magnitude and polarity). Programming the memory cell 300 can therefore involve applying a program pulse of a given polarity to induce a programming threshold event and application of current for a duration of time, which causes the memory cell 300 to exhibit a particular threshold voltage at a subsequent reading voltage of a same or different polarity. In one such embodiment, the storage material 302 is a self-selecting material that can be programmed by inducing a threshold event.

During a read operation, access circuitry 342 may determine a threshold voltage of a memory cell based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting a threshold voltage for a memory cell can include determining that the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word. The access lines 304, 306 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 308, 310 are disposed between storage material 302 and access lines 304, 306. Electrodes 308, 310 electrically couple access lines 304, 306 to storage material 302. Electrodes 308, 310 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

The memory cell 300 is one example of a memory cell that may be used as a multi-level cell (storing more than a single logical bit). Other embodiments can include memory cells having additional or different layers of material than illustrated in FIG. 3 (e.g., a selection device between the access line 304 and the storage element, a thin dielectric material between the storage material and access lines, or other suitable configuration).

Figure 4:
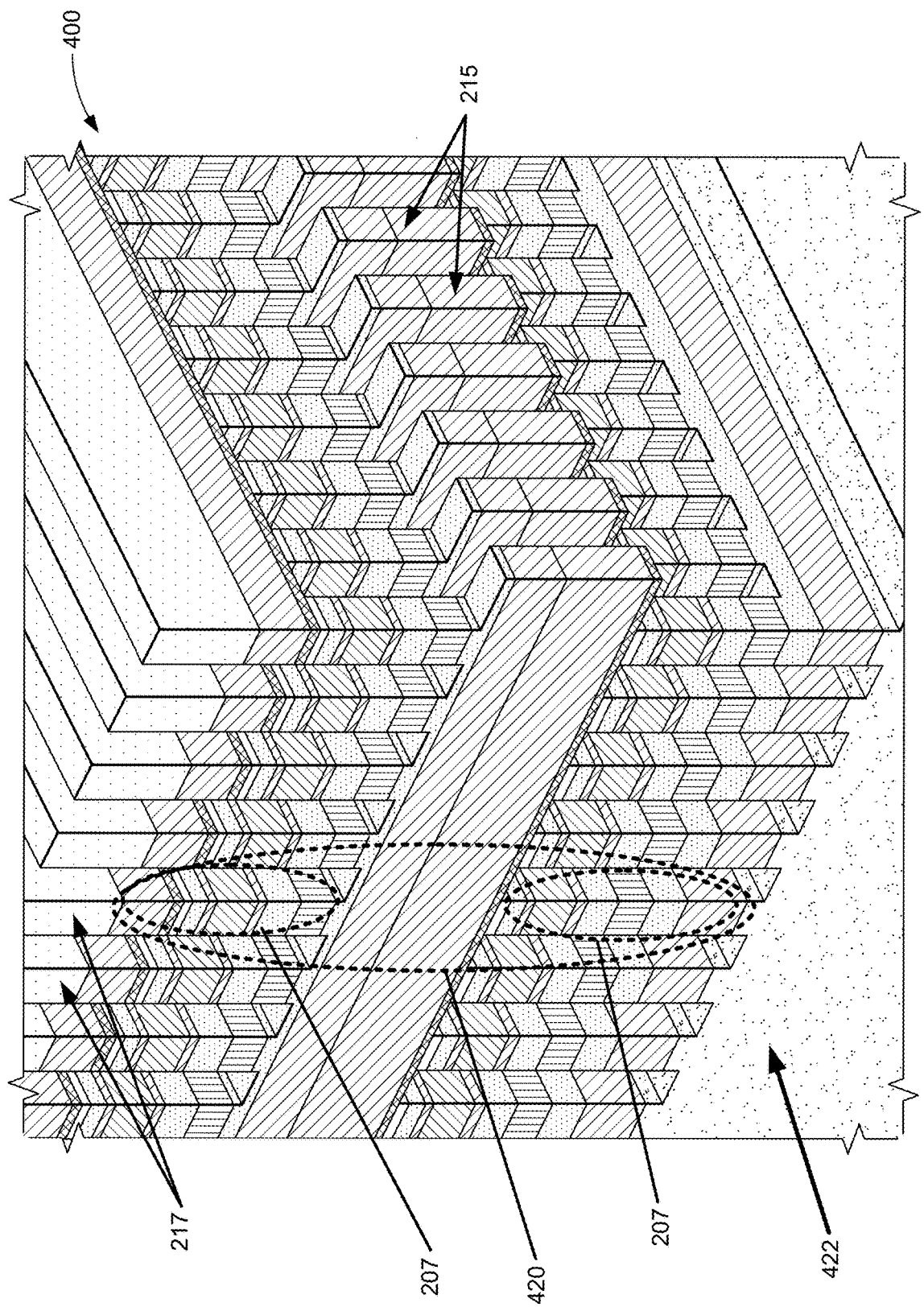
FIG. 4 is a perspective view of portions of a three-dimensional (3D) crosspoint memory stack according to one embodiment.

FIG. 4 is an isometric view of portions of a 3D crosspoint memory stack according to one embodiment. The specific layers are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

Figure 5:
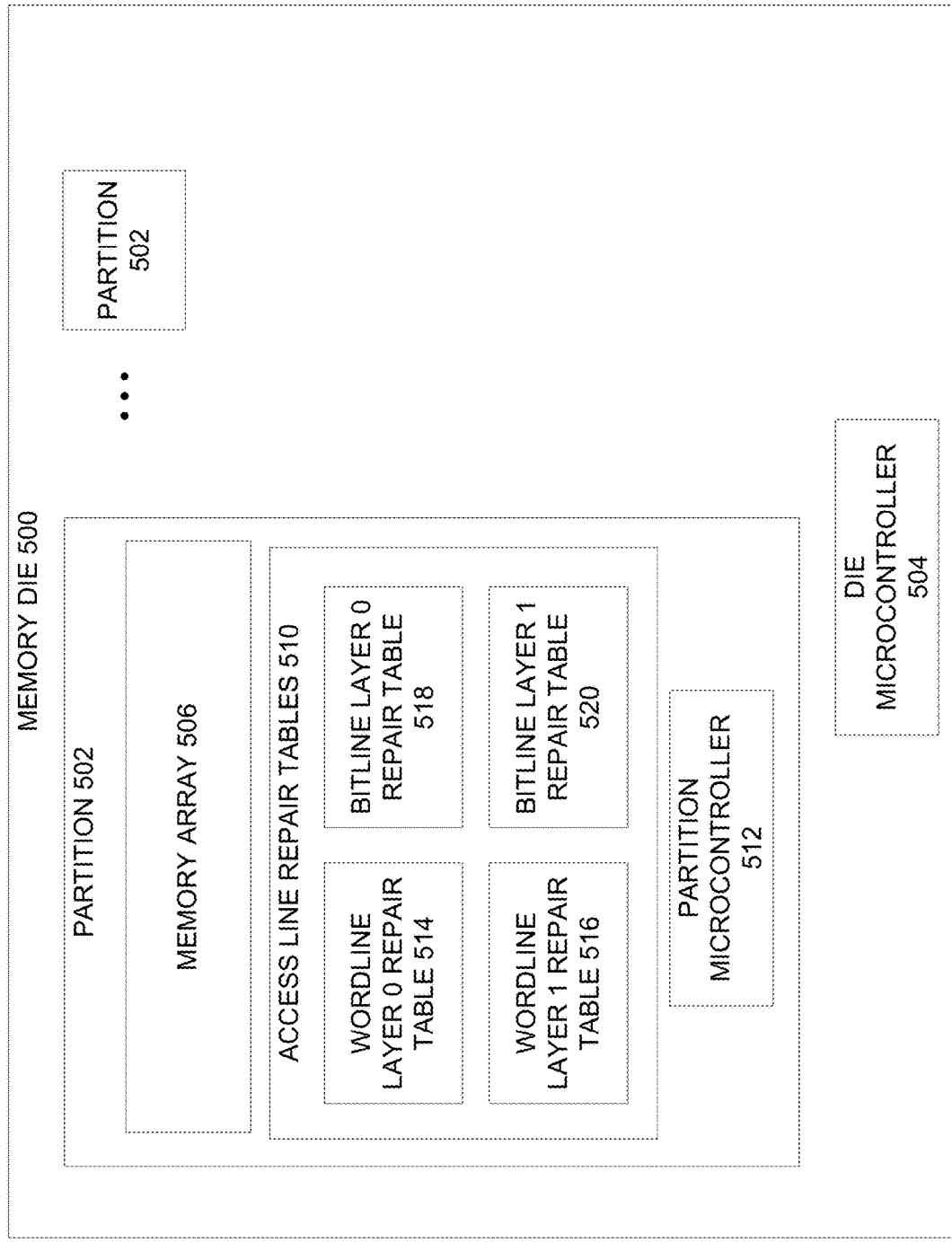
FIG. 5 illustrates components of a memory die in accordance with certain embodiments.

Referring now to FIG. 5, in one embodiment, a memory die 500 includes one or more partitions 502 and a die microcontroller 504. Each partition 502 includes a memory array 506, one or more access line repair tables 510, and a partition microcontroller 512.

The die microcontroller 504 and/or partition microcontroller 512 may be any suitable microcontroller, such as a stand-alone microcontroller or a microcontroller 504, 512 integrated into another component. For example, the microcontroller 504, 512 may be included in the chip controller 126, the storage device controller 118, a system memory device 107, the CPU memory controller 112, etc. The microcontroller 504, 512 may be implemented as hardware, software, firmware, or a combination thereof. In some embodiments, the microcontroller 504, 512 may be embodied as circuitry or collection of electrical devices. In some embodiments, some or all of the partition microcontroller 512 may be included in the die microcontroller 504. The microcontroller 504, 512 may receive and perform memory operations, including accessing the access line repair tables 510 to determine if a wordline or bitline of a memory operation has been remapped.

The memory die 500 may be any suitable memory die or chip, such as the memory chip 116 described above. In the illustrative embodiment, the memory die 500 is a phase-change-based memory die. In other embodiments, the memory die 500 may be based on a different type of memory, such as 3D NAND. The die microcontroller 504 may be implemented as hardware, software, firmware, or a combination thereof. The partitions 502 in the memory die 500 may be similar to the partitions 122 described above. The memory die 500 may have any suitable number of partitions 502, such as 4-256 partitions 502. In the illustrative embodiment, the memory die 500 has 32 partitions.

Each memory array 506 includes several arrays of wordlines and bitlines stacked on top of each other, with a memory cell at the crosspoint of each wordline and bitline. Each stack of wordlines and bitlines is referred to as a wordline (or bitline) layer, and each stack of memory is referred to as a deck. In some embodiments, a top wordline layer may be logically or physically connected to a bottom wordline layer. For example, in one embodiment, a memory array 506 may include, in order from bottom top, an array of wordline layer 0 wordlines, an array of bitline layer 0 bitlines, an array of wordline layer 1 wordlines, an array of bitline layer 1 bitlines, and an array of wordline layer 0 wordlines. The memory array 506 may have any suitable number of layers, such as 2-16. In the illustrative embodiment, the memory array 506 has four decks of memory cells. The memory array 506 may include any suitable number of memory cells, such as $2^{20}$-$2^{40}$ memory cells. The memory array 506 may include any suitable number of wordlines and/or bitlines, such as $2^{10}$-$2^{30}$ wordlines and/or bitlines. Any suitable number of wordlines and/or bitlines may be used as repair lines, such as 4-512.

In the illustrative embodiment, the memory array 506 includes more memory cells than the number of bits the partition 502 will be able to store when in use. As such, the memory array 506 includes one or more areas of redundant memory. In the illustrative embodiment, several wordlines and/or several bitlines are redundant wordlines and/or bitlines. When a faulty wordline and/or bitline is discovered, it can be remapped to one of the redundant wordlines and/or bitlines.

The access line repair tables 510 are used to map faulty access lines to redundant access lines. In the illustrative embodiment, the access line repair tables 510 includes a wordline layer 0 repair table 514, a wordline layer 1 repair table 516, a bitline layer 0 repair table 518, and a bitline layer 1 repair table 520. In other embodiments, the access line repair tables 510 may include tables for additional layers.

In the illustrative embodiment, the memory die 500 and/or partition 502 is tested at time of manufacture for faults in access lines. In other embodiments, the memory die 500 and/or partition 502 may be tested in another manner, such as when the memory die 500 and/or partition is first powered on by an end user. During testing, each wordline and/or bitline is tested for faults. If a fault is found, an address for the faulty wordline is stored in a table. For example, if a fault in a wordline for wordline layer 0 is found, the address can be stored as entry 602 in the embodiment of a wordline layer 0 repair table 514 shown in FIG. 6. If a fault in a wordline for wordline layer 0 is found and the wordline layer 0 repair table 514 is full, then the address of the wordline can be stored as entry 704 in the wordline layer 1 repair table 516 shown in FIG. 7. The wordline layer 1 repair table 516 can include entries such as entry 702 for faulty wordline layer 1 repairs, as well as empty entries such as entry 706. An empty entry may be one that is a special value, such as all zeros or all ones, or may be, e.g., an entry that has a bit set indicating that it is empty. Which entry an address of an access line matches in a table 510 indicates which redundant access line the access line is being remapped to. In the illustrative embodiment, a particular bit of a memory address (such as the most significant bit) indicates which layer a memory address corresponds to. For example, in one embodiment, a value of 0 for bit 13 in a memory address indicates that the memory address corresponds to wordline layer 0, and a value of 1 for bit 13 indicates that the memory address corresponds to a wordline layer 1. In the example embodiment shown in FIGS. 6 & 7, the memory address has 16 bits, and a most significant hexadecimal digit of 0-7 (i.e., a value of 0 for bit 16) indicates a wordline layer 0 address, and a most significant hexadecimal digit of 8-F (i.e., a value of 1 for bit 16) indicates a wordline layer 1 address.

In the illustrative embodiment, when an access line is remapped to a backup access line, an adjacent access line is also remapped, such as the adjacent access line with an address that is identical except for the least significant bit. To do so, in the illustrative embodiment, the access line repair table 510 stores all bits of a faulty wordline address except the least significant bit. When an access line address matches all bits of an entry except for the least significant bit of the access line address, then there is a match in the table 510. In such an embodiment, each entry in the access line repair table 510 corresponds to two access lines being remapped to two redundant access lines. Each access line repair table 510 may have any suitable number of entries, such as 4-128. In the illustrative embodiment, each wordline repair table has 16 entries (for a total of 32 entries), and each bitline repair table has 8 entries (for a total of 16 entries).

Figure 8:
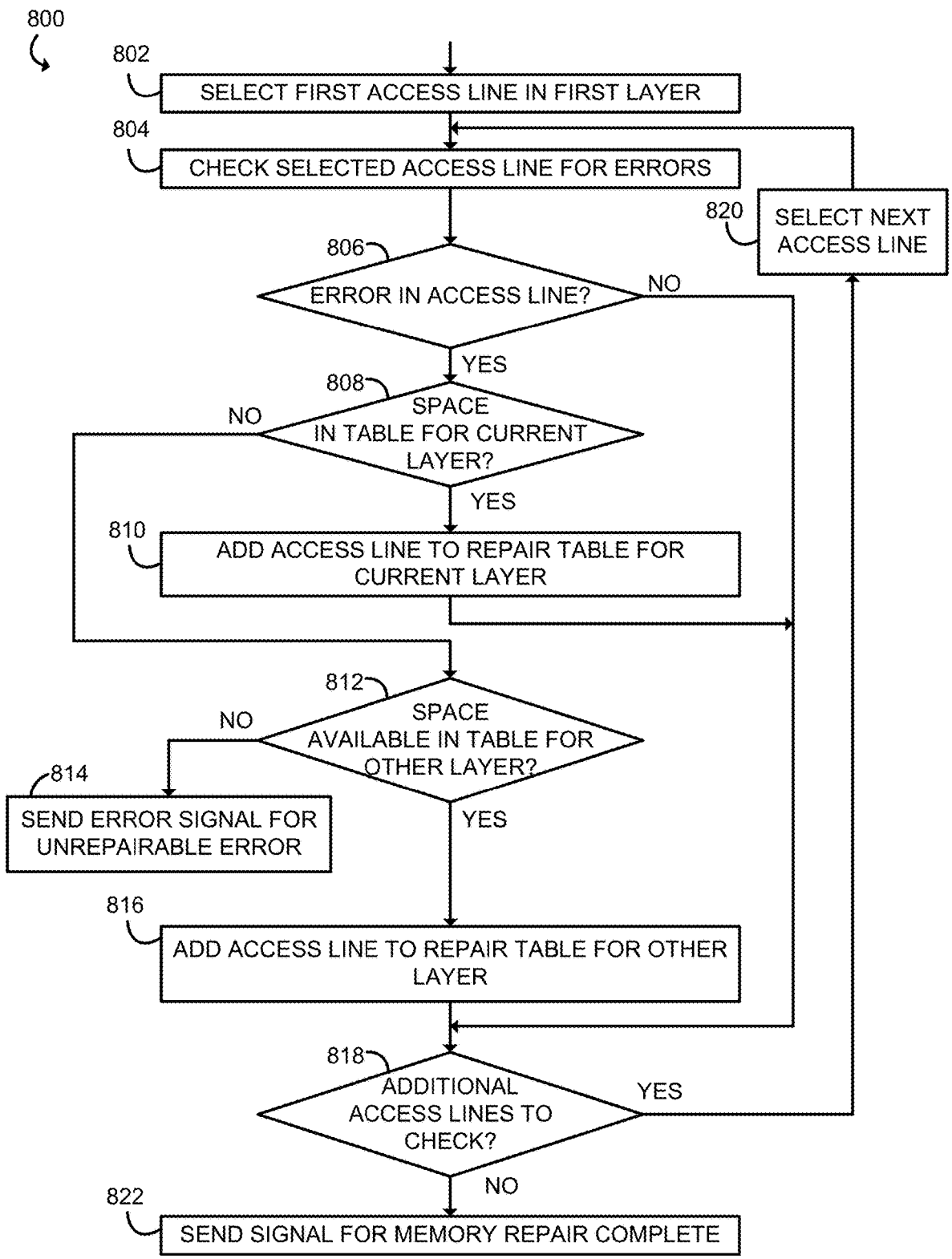
FIG. 8 is a simplified flow diagram of at least one embodiment of a method for finding and remapping faulty access lines in a memory partition.

Referring now to FIG. 8, in use, a partition microcontroller 512 may perform a method 800 for finding and remapping faulty access lines in a memory partition 502. Additionally or alternatively, in some embodiments, the method 800 may be performed by the die microcontroller 504, a storage device controller 118, or any other suitable microcontroller or other device. The method 800 begins in block 802, in which the microcontroller 512 selects the first access line in the first layer. In the illustrative embodiment, the method 800 may be performed once for the wordlines and once for the bitlines. The method 800 for the wordlines and the method 800 for the bitlines may be performed consecutively, in parallel, or in an interleaved manner. In the interest of clarity, the method 800 will be described in regard to one set of access lines, which may refer to either wordlines or bitlines. It should be appreciated that labeling one set of access lines wordlines and the other bitlines is arbitrary and does not limit the structure of the access lines so labeled.

In block 804, the microcontroller 512 checks the selected access line for error. To do so, the microcontroller 512 may, e.g., write a zero and a one to each bit and check whether the correct value is stored. The microcontroller 512 may analyze voltage and/or current characteristics of signals applied to an access line.

In block 806, if an error is not detected, the method 800 jumps to block 818 to check if there are additional access lines to check. If an error is detected, the method 800 proceeds to block 808 to check whether there is space in the access line repair table 510 for the current layer.

If there is space in the access line repair table 510 for the current layer, then the memory address for the selected access line is added to an entry of the access line repair table 510 for the current layer in block 810. In the illustrative embodiment, an entry is added to the access line repair table 510 by blowing fuses to set (or clear) bits. In the illustrative embodiment, both the selected access line and an adjacent access line are remapped when a fault is discovered. To do so, the least significant bit may not be added to the entry in the access line repair table 510, and an access line address will match the entry if all but its least significant bit match. The method 800 then jumps to block 818 to check if there are additional access lines to test for faults.

Referring back to block 808, if there is not space in the access line repair table 510 for the current layer, the method 800 proceeds to block 812, in which the microcontroller 512 determines whether there is space available in the access repair table 510 for another layer. In the illustrative embodiment, the access line repair table 510 for one other layer is checked. For example, if a memory partition 502 has wordline layer 0 and wordline layer 1, a wordline address for layer 0 or 1 could be stored in the access line repair table 510 for either wordline layer 0 or wordline layer 1, and a bitline address for layer 0 or 1 could be stored in the access line repair table 510 for bitline layer 0 or bitline layer 1. In other embodiments, any access line address could be stored in two or more access line repair tables 510 for other layers.

If there is no space available in the access line repair table 510 for the other layer, then the faulty wordline cannot be remapped and, as a result, the memory partition 502 cannot be repaired. The microcontroller 512 may send an error signal for an unrepairable error in block 814. If there is space available in the access line repair table 510 for the other layer, then the method 800 proceeds to block 816 to add the access line to the access line repair table 510 for the other layer.

In block 818, the microcontroller 512 determines whether there are additional access lines to check. If there are, the method 800 proceeds to block 820 to select the next access line. If all of the access lines for one layer have been checked, the microcontroller 512 proceeds to checking access lines for the next layer. The method 800 then proceeds to block 804 to check for an error in the newly selected access line.

Referring back to block 818, if there are no additional access lines to check, the method 800 proceeds to block 822, in which the microcontroller 512 sends a signal that the memory repair has been successfully completed.

Figure 9:
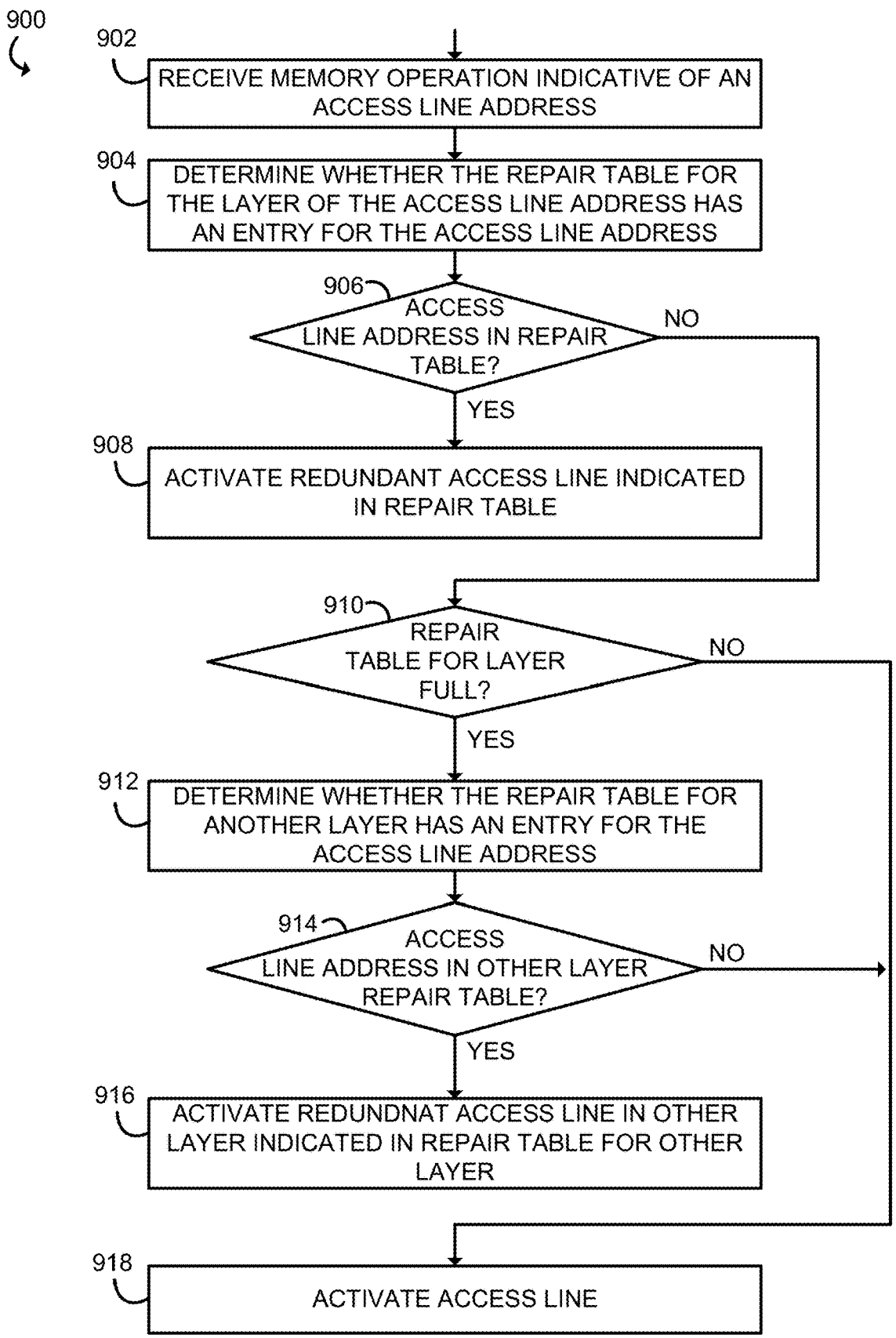
FIG. 9 is a simplified flow diagram of at least one embodiment of a method for accessing memory cells in a memory die.

Referring now to FIG. 9, in use, a partition microcontroller 512 may perform a method 900 for accessing memory cells in a memory die 500. Additionally or alternatively, in some embodiments, the method 900 may be performed by the die microcontroller 504, a storage device controller 118, or any other suitable microcontroller or other device. The method 900 describes how an access line address of a memory operation can be checked and, if corresponding to a faulty access line, can be remapped. In the illustrative embodiment, the method 900 may be performed in parallel for a wordline and for a bitline. In the interest of clarity, the method 900 will refer to an access line, which could correspond to a wordline or a bitline.

The method 900 begins in block 902, in which the microcontroller 512 receives a memory operation indicative of an access line address. In the illustrative embodiment, the memory operation will include a memory address, which can be used to determine a corresponding wordline and bitline. Additionally or alternatively, the memory operation may include the address of the access line.

In block 904, the microcontroller 512 determines whether the repair table for the layer of the access line address has an entry for the access line address. If it does, the method 900 proceeds to block 908, in which the microcontroller 512 replaces the access line address with a redundant access line address in the repair table and then activates the redundant access line corresponding to the redundant access line address for the memory operation.

Referring back to block 906, if the repair table for the layer of the access line address does not have an entry for the access line address, the method 900 proceeds to block 910 to check whether the repair table for the layer of the access line address is full. If it is not, then the access line corresponding to the access line address is not faulty, and the method 900 proceeds to block 918, in which the microcontroller 512 activates the access line corresponding to the access line address.

Referring back to block 910, if the repair table for the layer of the access line address is full, then an entry for the access line address could be in a repair table for another layer. The microcontroller 512 determines whether the repair table for another layer has an entry for the access line address in block 912. In illustrative embodiment, the microcontroller 512 checks one other layer that is paired with layer of the access line address. In other embodiments, the microcontroller 512 may check repair tables of two or more other layers.

It should be appreciated that, in the illustrative embodiment, the check for whether the access line address is in the repair table in block 906 is done in parallel with the check for whether the repair table for the layer is full in block 910 and/or is done in parallel with the check for whether the access line address is in another layer repair table in block 914. In other embodiments, some or all of the checks may be done serially.

In block 914, if the access line address is found in a repair table for another layer, the method 900 proceeds to block 916, in which the microcontroller 512 replaces the access line address with a redundant access line address in the repair table for the other and then activates the redundant access line corresponding to the redundant access line address for the memory operation.

Referring back to block 914, if the access line address is not found in a repair table for another layer, the method 900 proceeds to block 918, in which the microcontroller 512 activates the access line corresponding to the access line address.

Examples

Illustrative examples of the technologies disclosed herein are provided below. An embodiment of the technologies may include any one or more, and any combination of, the examples described below.

Example 1 includes a memory die comprising a plurality of partitions, wherein each of the plurality of partitions comprises a plurality of layers; and a microcontroller, the microcontroller to receive a memory operation indicative of a wordline address, wherein the wordline address corresponds to a wordline in a first layer of the plurality of layers of a partition of the plurality of partitions; and activate, in response to receipt of the memory operation, a redundant wordline in a second layer of the plurality of layers of the partition, wherein the second layer is different from the first layer.

Example 2 includes the subject matter of Example 1, and wherein each of the plurality of partitions comprises a wordline repair table for each layer of the plurality of layers of the corresponding partition, wherein each wordline repair table for each layer of the plurality of layers of each partition of the plurality of partitions indicates which wordline addresses are be remapped to redundant wordline addresses of the corresponding layer, wherein the microcontroller is to determine, in response to receipt of the memory operation, whether a wordline repair table for the first layer has an entry corresponding to the wordline address; and determine, in response to a determination that the wordline repair table for the first layer does not have an entry corresponding to the wordline address, whether a wordline repair table for the second layer has an entry corresponding to the wordline address; wherein to activate the redundant wordline in the second layer comprises to activate, in response to a determination that the wordline repair table for the second layer has an entry corresponding to the wordline address, the redundant wordline, wherein an entry corresponding to the wordline address in the wordline repair table for the second layer indicates that the redundant wordline is to replace a wordline corresponding to the wordline address.

Example 3 includes the subject matter of any of Examples 1 and 2, and wherein the microcontroller is to determine, in response to a determination that the wordline repair table for the first layer does not have an entry corresponding to the wordline address, whether the wordline repair table for the first layer is full, wherein to determine whether a wordline repair table for the second layer has an entry corresponding to the wordline address comprises to determine, in response to a determination that the wordline repair table for the first layer is full, whether a wordline repair table for the second layer has an entry corresponding to the wordline address.

Example 4 includes the subject matter of any of Examples 1-3, and wherein to determine whether a wordline repair table for the first layer has an entry corresponding to the wordline address comprises to check all bits of the wordline address except one for a match in the wordline repair table.

Example 5 includes the subject matter of any of Examples 1-4, and wherein the microcontroller is to determine a redundant wordline address corresponding to the redundant wordline based on the entry corresponding to the wordline address in the wordline repair table for the second layer and one bit of the wordline address.

Example 6 includes the subject matter of any of Examples 1-5, and wherein each partition of the plurality of partitions comprises at least 230 bits.

Example 7 includes the subject matter of any of Examples 1-6, and wherein each wordline repair table of each layer of the plurality of layers of each partition of the plurality of partitions comprises at least 16 entries.

Example 8 includes the subject matter of any of Examples 1-7, and wherein each of the plurality of partitions comprises a wordline repair table for each layer of the plurality of layers of the corresponding partition, wherein each wordline repair table for each layer of the plurality of layers of each partition of the plurality of partitions indicates which wordline addresses are be remapped to redundant wordline addresses of the corresponding layer, wherein each wordline repair table of each layer of the plurality of layers of each partition of the plurality of partitions has a number, n, of entries, wherein the memory die is able to remap more than n wordline addresses of the first layer to redundant wordline addresses.

Example 9 includes the subject matter of any of Examples 1-8, and wherein the memory die is a phase-change-based memory die.

Example 10 includes the subject matter of any of Examples 1-9, and wherein the microcontroller is further to select a test wordline address to be checked for one or more errors, wherein the test wordline address corresponds to a test wordline of the first layer; determine whether the test wordline corresponding to the test wordline address has one or more errors; determine, in response to a determination that the test wordline corresponding to the test wordline address has one or more errors, whether a repair table corresponding to the first layer is full; and add, in response to a determination that the repair table corresponding to the first layer is full, the test wordline address to a repair table of the second layer.

Example 11 includes the subject matter of any of Examples 1-10, and wherein to add the test wordline address to the repair table of the second layer comprises to add all but one bit of the test wordline address to the repair table of the second layer.

Example 12 includes the subject matter of any of Examples 1-11, and wherein the microcontroller is to select a second test wordline address of the memory die to be checked for one or more errors, wherein the second test wordline address corresponds to a second test wordline of the first layer; determine whether the second test wordline corresponding to the second test wordline address has one or more errors; determine, in response to a determination that the second test wordline corresponding to the second test wordline address has one or more errors, whether the repair table corresponding to the first layer is full; and add, in response to a determination that the repair table corresponding to the first layer is not full, the second test wordline address to the repair table of the first layer.

Example 13 includes a system comprising the memory die of claim 1, the system comprising one or more processors; and one or more storage devices communicatively coupled to the one or more processors, the one or more storage devices comprising the memory die.

Example 14 includes a memory die comprising a plurality of partitions, wherein each of the plurality of partitions comprises a plurality of layers, wherein each of the plurality of partitions comprises a wordline repair table for each layer of the plurality of layers of the corresponding partition, wherein each wordline repair table for each layer of the plurality of layers of each partition of the plurality of partitions indicates which wordline addresses are remapped to redundant wordline addresses of the corresponding layer; and a microcontroller, the microcontroller to receive a memory operation indicative of a wordline address, wherein the wordline address corresponds to a wordline in a first layer of the plurality of layers of a partition of the plurality of partitions; and determine, in response to receipt of the memory operation, whether the wordline repair table for a second layer of the plurality of layers of the partition has an entry corresponding to the wordline address.

Example 15 includes the subject matter of Example 14, and wherein the microcontroller is to determine, in response to receipt of the memory operation, whether a wordline repair table for the first layer has an entry corresponding to the wordline address, wherein to determine whether the wordline repair table for a second layer of the plurality of layers of the partition has an entry corresponding to the wordline address comprises to determine, in response to a determination that the wordline repair table for the first layer does not have an entry corresponding to the wordline address, whether the wordline repair table for a second layer of the plurality of layers of the partition has an entry corresponding to the wordline address.

Example 16 includes the subject matter of any of Examples 14 and 15, and wherein the microcontroller is to determine, in response to a determination that the wordline repair table for the first layer does not have an entry corresponding to the wordline address, whether the wordline repair table for the first layer is full, wherein to determine whether a wordline repair table for the second layer has an entry corresponding to the wordline address comprises to determine, in response to a determination that the wordline repair table for the first layer is full, whether a wordline repair table for the second layer has an entry corresponding to the wordline address.

Example 17 includes the subject matter of any of Examples 14-16, and wherein to determine whether a wordline repair table for the first layer has an entry corresponding to the wordline address comprises to check all bits of the wordline address except one for a match in the wordline repair table.

Example 18 includes the subject matter of any of Examples 14-17, and wherein the microcontroller is to determine a redundant wordline address corresponding to a redundant wordline based on the entry corresponding to the wordline address in the wordline repair table for the second layer and one bit of the wordline address.

Example 19 includes the subject matter of any of Examples 14-18, and wherein each partition of the plurality of partitions comprises at least 230 bits.

Example 20 includes the subject matter of any of Examples 14-19, and wherein each wordline repair table of each layer of the plurality of layers of each partition of the plurality of partitions comprises at least 16 entries.

Example 21 includes the subject matter of any of Examples 14-20, and wherein each of the plurality of partitions comprises a wordline repair table for each layer of the plurality of layers of the corresponding partition, wherein each wordline repair table for each layer of the plurality of layers of each partition of the plurality of partitions indicates which wordline addresses are be remapped to redundant wordline addresses of the corresponding layer, wherein each wordline repair table of each layer of the plurality of layers of each partition of the plurality of partitions has a number, n, of entries, wherein the memory die is able to remap more than n wordline addresses of the first layer to redundant wordline addresses.

Example 22 includes the subject matter of any of Examples 14-21, and wherein the memory die is a phase-change-based memory die.

Example 23 includes a system comprising the memory die of claim 14, the system comprising one or more processors; and one or more storage devices communicatively coupled to the one or more processors, the one or more storage devices comprising the memory die.

Example 24 includes a method comprising selecting, by a microcontroller, a wordline address of a memory die to be checked for one or more errors, wherein the wordline address corresponds to a wordline of a first layer of a plurality of layers of a partition of the memory die; determining, by the microcontroller, whether the wordline corresponding to the wordline address has one or more errors;

determining, by the microcontroller and in response to a determination that the wordline corresponding to the wordline address has one or more errors, whether a repair table corresponding to the first layer is full; and adding, by the microcontroller and in response to a determination that the repair table corresponding to the first layer is full, the wordline address to a repair table of a second layer of the plurality of layers, wherein the second layer is different from the first layer.

Example 25 includes the subject matter of Example 24, and wherein adding the wordline address to the repair table of the second layer comprises adding all but one bit of the wordline address to the repair table of the second layer.

Example 26 includes the subject matter of any of Examples 24 and 25, and further including selecting, by the microcontroller, a second wordline address of the memory die to be checked for one or more errors, wherein the second wordline address corresponds to a second wordline of the first layer; determining, by the microcontroller, whether the second wordline corresponding to the second wordline address has one or more errors; determining, by the microcontroller and in response to a determination that the second wordline corresponding to the second wordline address has one or more errors, whether the repair table corresponding to the first layer is full; and adding, by the microcontroller and in response to a determination that the repair table corresponding to the first layer is not full, the second wordline address to the repair table of the first layer.

The invention claimed is:

1. A memory die comprising:
a plurality of partitions, wherein each of the plurality of partitions comprises a plurality of layers; and
a microcontroller, the microcontroller to:
receive a memory operation indicative of a wordline address, wherein the wordline address corresponds to a wordline in a first layer of the plurality of layers of a partition of the plurality of partitions; and
activate, in response to receipt of the memory operation, a redundant wordline in a second layer of the plurality of layers of the partition, wherein the second layer is different from the first layer,
wherein each of the plurality of partitions comprises a wordline repair table for each layer of the plurality of layers of the corresponding partition, wherein each wordline repair table for each layer of the plurality of layers of each partition of the plurality of partitions indicates which wordline addresses are to be remapped to redundant wordline addresses of the corresponding layer.

2. The memory die of claim 1, wherein the microcontroller is to:
determine, in response to receipt of the memory operation, whether a wordline repair table for the first layer has an entry corresponding to the wordline address; and
determine, in response to a determination that the wordline repair table for the first layer does not have an entry corresponding to the wordline address, whether a wordline repair table for the second layer has an entry corresponding to the wordline address;
wherein to activate the redundant wordline in the second layer comprises to activate, in response to a determination that the wordline repair table for the second layer has an entry corresponding to the wordline address, the redundant wordline, wherein an entry corresponding to the wordline address in the wordline repair table for the second layer indicates that the redundant wordline is to replace a wordline corresponding to the wordline address.

3. The memory die of claim 2, wherein the microcontroller is to determine, in response to a determination that the wordline repair table for the first layer does not have an entry corresponding to the wordline address, whether the wordline repair table for the first layer is full,
wherein to determine whether a wordline repair table for the second layer has an entry corresponding to the wordline address comprises to determine, in response to a determination that the wordline repair table for the first layer is full, whether a wordline repair table for the second layer has an entry corresponding to the wordline address.

4. The memory die of claim 2, wherein to determine whether a wordline repair table for the first layer has an entry corresponding to the wordline address comprises to check all bits of the wordline address except one for a match in the wordline repair table.

5. The memory die of claim 2, wherein the microcontroller is to determine a redundant wordline address corresponding to the redundant wordline based on the entry corresponding to the wordline address in the wordline repair table for the second layer and one bit of the wordline address.

6. The memory die of claim 1, wherein each wordline repair table of each layer of the plurality of layers of each partition of the plurality of partitions has a number, n, of entries,
wherein the memory die is able to remap more than n wordline addresses of the first layer to redundant wordline addresses.

7. The memory die of claim 1, wherein the memory die is a phase-change-based memory die.

8. The memory die of claim 1, wherein the microcontroller is further to:
select a test wordline address to be checked for one or more errors, wherein the test wordline address corresponds to a test wordline of the first layer;
determine whether the test wordline corresponding to the test wordline address has one or more errors;
determine, in response to a determination that the test wordline corresponding to the test wordline address has one or more errors, whether a repair table corresponding to the first layer is full; and
add, in response to a determination that the repair table corresponding to the first layer is full, the test wordline address to a repair table of the second layer.

9. The memory die of claim 8, wherein to add the test wordline address to the repair table of the second layer comprises to add all but one bit of the test wordline address to the repair table of the second layer.

10. The memory die of claim 8, wherein the microcontroller is to:
select a second test wordline address of the memory die to be checked for one or more errors, wherein the second test wordline address corresponds to a second test wordline of the first layer;
determine whether the second test wordline corresponding to the second test wordline address has one or more errors;
determine, in response to a determination that the second test wordline corresponding to the second test wordline address has one or more errors, whether the repair table corresponding to the first layer is full; and add, in response to a determination that the repair table corresponding to the first layer is not full, the second test wordline address to the repair table of the first layer.

11. A system comprising the memory die of claim 1, the system comprising:
one or more processors; and
one or more storage devices communicatively coupled to the one or more processors, the one or more storage devices comprising the memory die.

12. A memory die comprising:
a plurality of partitions, wherein each of the plurality of partitions comprises a plurality of layers, wherein each of the plurality of partitions comprises a wordline repair table for each layer of the plurality of layers of the corresponding partition, wherein each wordline repair table for each layer of the plurality of layers of each partition of the plurality of partitions indicates which wordline addresses are remapped to redundant wordline addresses of the corresponding layer; and
a microcontroller, the microcontroller to:
receive a memory operation indicative of a wordline address, wherein the wordline address corresponds to a wordline in a first layer of the plurality of layers of a partition of the plurality of partitions; and
determine, in response to receipt of the memory operation, whether the wordline repair table for a second layer of the plurality of layers of the partition has an entry corresponding to the wordline address.

13. The memory die of claim 12, wherein the microcontroller is to:
determine, in response to receipt of the memory operation, whether a wordline repair table for the first layer has an entry corresponding to the wordline address,
wherein to determine whether the wordline repair table for a second layer of the plurality of layers of the partition has an entry corresponding to the wordline address comprises to determine, in response to a determination that the wordline repair table for the first layer does not have an entry corresponding to the wordline address, whether the wordline repair table for a second layer of the plurality of layers of the partition has an entry corresponding to the wordline address.

14. The memory die of claim 13, wherein the microcontroller is to determine, in response to a determination that the wordline repair table for the first layer does not have an entry corresponding to the wordline address, whether the wordline repair table for the first layer is full,
wherein to determine whether a wordline repair table for the second layer has an entry corresponding to the wordline address comprises to determine, in response to a determination that the wordline repair table for the first layer is full, whether a wordline repair table for the second layer has an entry corresponding to the wordline address.

15. The memory die of claim 12, wherein each of the plurality of partitions comprises a wordline repair table for each layer of the plurality of layers of the corresponding partition, wherein each wordline repair table for each layer of the plurality of layers of each partition of the plurality of partitions indicates which wordline addresses are be remapped to redundant wordline addresses of the corresponding layer,
wherein each wordline repair table of each layer of the plurality of layers of each partition of the plurality of partitions has a number, n, of entries,
wherein the memory die is able to remap more than n wordline addresses of the first layer to redundant wordline addresses.

16. The memory die of claim 12, wherein the memory die is a phase-change-based memory die.

17. A system comprising the memory die of claim 12, the system comprising:
one or more processors; and
one or more storage devices communicatively coupled to the one or more processors, the one or more storage devices comprising the memory die.

18. A method comprising:
selecting, by a microcontroller, a wordline address of a memory die to be checked for one or more errors, wherein the wordline address corresponds to a wordline of a first layer of a plurality of layers of a partition of the memory die;
determining, by the microcontroller, whether the wordline corresponding to the wordline address has one or more errors;
determining, by the microcontroller and in response to a determination that the wordline corresponding to the wordline address has one or more errors, whether a repair table corresponding to the first layer is full; and
adding, by the microcontroller and in response to a determination that the repair table corresponding to the first layer is full, the wordline address to a repair table of a second layer of the plurality of layers, wherein the second layer is different from the first layer.

19. The method of claim 18, wherein adding the wordline address to the repair table of the second layer comprises adding all but one bit of the wordline address to the repair table of the second layer.

20. The method of claim 18, further comprising:
selecting, by the microcontroller, a second wordline address of the memory die to be checked for one or more errors, wherein the second wordline address corresponds to a second wordline of the first layer;
determining, by the microcontroller, whether the second wordline corresponding to the second wordline address has one or more errors;
determining, by the microcontroller and in response to a determination that the second wordline corresponding to the second wordline address has one or more errors, whether the repair table corresponding to the first layer is full; and
adding, by the microcontroller and in response to a determination that the repair table corresponding to the first layer is not full, the second wordline address to the repair table of the first layer.

* * * * *